(12) United States Patent
Beck

(10) Patent No.: US 6,236,371 B1
(45) Date of Patent: May 22, 2001

(54) SYSTEM AND METHOD FOR TESTING ANTENNA FREQUENCY RESPONSE

(75) Inventor: Brian C. Beck, Melbourne Beach, FL (US)

(73) Assignee: Harris Corporation, Palm Bay, FL (US)

(*) Notice: Subject to any disclaimer, the term of this patent is extended or adjusted under 35 U.S.C. 154(b) by 0 days.

(21) Appl. No.: 09/361,479

(22) Filed: Jul. 26, 1999

(51) Int. Cl.[7] ................................................. G01R 1/24
(52) U.S. Cl. ..................... 343/703; 342/189; 342/192; 455/67.3; 455/67.4
(58) Field of Search ......................... 343/703; 342/165, 342/172, 189, 192; 455/155, 205, 226.1, 67.3, 67.4

(56) References Cited

U.S. PATENT DOCUMENTS

| 2,987,586 | 6/1961 | Berger ............................ 179/175.3 |
|---|---|---|
| 3,605,018 | 9/1971 | Coviello ................................ 325/65 |
| 3,694,643 | 9/1972 | Smith ................................... 235/181 |
| 3,875,500 | 4/1975 | Fletcher et al. ................... 324/57 PS |
| 4,028,622 | 6/1977 | Evans et al. ...................... 324/57 N |
| 4,249,257 | * 2/1981 | Campbell ............................. 455/115 |
| 4,275,446 | 6/1981 | Blaess .................................. 455/67 |
| 4,648,124 | 3/1987 | Mantovani et al. .................. 455/67 |
| 4,932,075 | * 6/1990 | Dimitrijevic et al. ............ 455/226.1 |
| 5,048,015 | 9/1991 | Zilberfarb ......................... 370/110.4 |
| 5,072,189 | * 12/1991 | Openlander .......................... 324/638 |
| 5,103,459 | 4/1992 | Gilhousen et al. ...................... 375/1 |
| 5,235,327 | * 8/1993 | Igarashi et al. ...................... 455/343 |
| 5,371,760 | 12/1994 | Allen et al. ......................... 455/67.4 |
| 5,461,921 | 10/1995 | Papadakis et al. ..................... 73/628 |
| 5,649,304 | 7/1997 | Cabot ................................. 455/67.4 |
| 5,839,096 | * 11/1998 | Lyons et al. .......................... 342/165 |
| 6,011,962 | * 1/2000 | Lindenmeier et al. ............ 455/226.1 |
| 6,075,480 | * 6/2000 | Deliberis, Jr. ....................... 342/169 |
| 6,118,962 | * 9/2000 | Ghisler et al. ...................... 455/67.4 |

OTHER PUBLICATIONS

D. Burkhart, "Intermodulation and Crossmodulation Measured Automatically from 25 to 1000 Megahertz," News from Rohde & Schwartz, vol. 16, No. 74, 1976, pp. 7–10.

* cited by examiner

Primary Examiner—Don Wong
Assistant Examiner—Thuy Vinh Tran
(74) Attorney, Agent, or Firm—Allen, Dyer, Doppelt, Milbrath & Gilchrist, P.A.

(57) ABSTRACT

A system and method tests the frequency response of a linear time-invariant unit-under-test, such as an antenna. A test signal is generated at a selected frequency and modulated with a spread spectrum input excitation signal to produce a broadband test signal that is substantially wider than the bandwidth of a device-under-test. The test signal is transmitted from one of either the unit-under-test or test device to a responsive test device or unit-under-test. The test signal is demodulated by mixing an input excitation signal that is delayed and increased in steps, such that the difference in time generates an estimate of the impulse response of the unit-under-test. The test signal is correlated and integrated to filter out unwanted interference and reflections.

58 Claims, 4 Drawing Sheets

SYSTEM AND METHOD FOR TESTING ANTENNA FREQUENCY RESPONSE

FIELD OF THE INVENTION

This invention relates to testing the frequency response of devices, and more particularly, this invention relates to testing antenna frequency response.

BACKGROUND OF THE INVENTION

Antennas are used for a wide variety of communications, radar and other applications, both in a transmit and in a receive mode. Antennas may take many shapes and forms, from simple whips to complex reflector schemes, to phased arrays, and may be used on the earth's surface, in the air or in space. No matter what type of application, antennas are principally characterized by a broad set of gain or gain-related parameters. These include primary gain (in the intended direction, and relative to some reference standard such as isotropic), gain patterns over all angles from the intended direction, and frequency response (gain as a function of frequency). For some applications, a desired specific frequency response must be attained, often seeking as wide a bandwidth as possible. For these reasons, antenna testing must be conducted during antenna development, adjustment or maintenance to measure gain and frequency response (including phase and amplitude response).

The measuring antenna gain is difficult due to the fact that antenna gain tests can be effected by extraneous reflections off walls and by other signals. Antenna gain testing and any related pattern testing typically occurs in an anechoic chamber, where many parameters can be measured, such as the antenna gain and the frequency/phase response. Typically, the anechoic chamber is a building that is designed and manufactured to have few echoes, such as those produced by signal reflections from natural and man-made objects. The chamber surface is covered with electro-magnetically absorbing cones, which absorb any reflective signals. The anechoic chamber is also designed so that the area is free of extraneous signals, such as citizen band radio signals and other interfering or jamming signals. Naturally, these anechoic chambers are very expensive.

One conventional approach used for testing for antenna response is to place an antenna-under-test in the anechoic chamber, together with a test antenna, and transmit a radio frequency or microwave signal from one antenna to the other antenna (in either direction). After the signal is received within the antenna, a receiver measures antenna gain through appropriate means known to those skilled in the art, such as possibly using a spectrum analyzer. In some instances, the frequency versus phase response is determined using either a slowly-swept sine wave on at "spot" frequencies. However, reflections off the wall of the test signal sometimes cause extraneous results. Thus, unless alternatives are found for the very stringent design requirements necessary for operating anechoic chambers for testing antenna response, it is mandatory that large expenditures of personnel time, money and other resources be placed into the design, testing, manufacture and operation of these sophisticated anechoic chambers. An example of an improved system and method for testing antenna gain is disclosed in U.S. patent application Ser. No. 09/290,467, filed Apr. 12, 1999, entitled, "SYSTEM AND METHOD FOR TESTING ANTENNA GAIN," by the same inventor and assigned to the same assignee, the disclosure which is hereby incorporated by reference in its entirety.

It is often desirable to test the frequency response of an antenna, which often behaves similarly to a linear, time-invariant unit-under-test. Again, the expensive anechoic chambers have been required to reduce the errors caused by reflections during test. Occasionally, outdoor ranges are used to reduce reflections, but this approach can also be costly and still suffers from the possibility of reflections of nearby objects, as well as unwanted interference.

SUMMARY OF THE INVENTION

It is, therefore, an object of the present invention to provide a system and method of testing for antenna frequency response either without using an anechoic chamber, or outdoor range, at all, or using one having less stringent design requirements.

It is still another object of the present invention to provide a system and method of testing for antenna frequency response that is not prone to deviant measurements due to extraneous signals in the nearby environment.

To measure antenna frequency response, a spread spectrum PN test signal is generated with a bandwidth substantially in excess of the expected bandwidth of the antenna-under-test. As the spread spectrum signal passes through the antenna, which typically behaves as a band-pass filter, the spread spectrum signal is filtered in amplitude and phase, corresponding to the frequency response of interest. The antenna-under-test, being a band-pass filter, has an impulse response corresponding to the filter's frequency response (both amplitude and phase). The test receiver, by mixing a locally generated replica of the original test signal with the received (and band-pass filtered by the antenna-under-test) signal, selectively collapses the resultant mixed product's bandwidth to a narrow frequency, or down-converted to baseband, wherein the energy corresponds to the cross-correlation of the replica and the filtered spread spectrum signals as a function of time difference, $\tau$.

A variable timing operator in either the transmitter or receiver allows the relative timing of the replica and the original to be precisely controlled, so the difference in time, $\tau$, can be gradually stepped to generate an estimate of the impulse response of the antenna. The cross-correlation function $R(\tau)$ corresponds to the baseband equivalent impulse response of the antenna under test as a function of time, $\delta(t)$. While the impulse response itself may be of some limited value, the frequency response may be simply derived from $\delta(t)$ by performing a Fourier transform process (such as a Fast Fourier Transform or FFT). The resultant power spectral density may be easily converted to the frequency response of the unit-under-test by those skilled in the general art.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous over prior art systems and methods for testing antenna frequency response of a unit-under-test (device-under-test), such as an antenna, because the necessity of having an anechoic chamber with stringent design requirements is no longer necessary. In the present invention, the antenna can now be tested without concern for any reflective signals, such as from walls, fences or trees, or extraneous signals, such as those emanating from citizen band radios.

Figure 1:
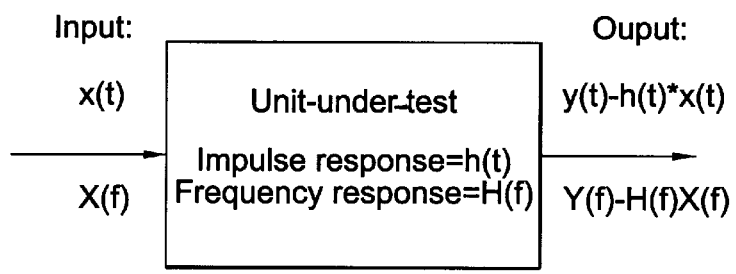
FIG. 1 illustrates a basic unit-under-test, such as the antenna-under-test showing the input and output signals.

An antenna-under-test, or, in general, any linear, time-invariant filter-under-test, can be modeled as shown in FIG. 1, where $$X(f) = F[y(t)] \text{ and } Y(f) = F[y(t)]$$

and where F is the Fourier transform, defined as:

$$F[u(t)] = \int_{-\infty}^{\infty} u(t) e^{-j2\pi f t} dt$$

and where the function denoted by "*" is the convolution integral defined by:

$$m(t) * n(t) = \int_{-\infty}^{\infty} m(\lambda) n(t - \lambda) d\lambda$$

In the case where x(t) is a unit impulse function δ(t), then, $$X(f) = F[\delta(t)] = 1,$$

and Y(f)=H(f), when x(t)=δ(t).

In the present invention, the frequency response, H(f) is measured, such as of an antenna-under-test or other linear, time-invariant filter-under-test (also device-under-test). Measuring the output response to an impulse can provide the information necessary to calculate H(f), in both amplitude and phase. However, using impulses for frequency response testing is generally considered impractical, because of the small amount of energy contained in any impulse approximation of finite amplitude. Noise, linearity limitations, and short time measurement problems all render impulse testing generally impractical, especially for radio frequency and microwave testing. Instead, swept sine waves are used, with power meters and/or spectrum analyzers.

In addition, both impulse and swept sine wave testing are vulnerable to unwanted reflections of the test signals from nearby objects. Indoors, these objects might be walls, a floor, ceiling or equipment. Outdoors, reflections can occur from the ground, nearby buildings, fences, etc. In either case, reflections add energy to the measurement receiver input which combines with the desired test signals and can corrupt the measurements. Similarly, incidental interference from other radio frequency emitters in the same frequency band, from any of many sources, can cause erroneous or inaccurate measurements.

For these reasons, antenna testing is typically conducted inside special chambers called anechoic chambers, which contain radio frequency absorbing material on all interior surfaces, to absorb reflections and interference before they can corrupt measurements. Anechoic chambers are generally very expensive.

The present invention either removes the need for anechoic chambers altogether, or at least ameliorates the stringent requirements for them. The present invention also eliminates the effect of extraneous interfering signals on measurements. These benefits are possible because the technique of the present invention rejects reflections and interference by rendering them uncorrelated with respect to the desired test signal(s), so that they may be filtered away.

The present invention offers a technique for deriving the impulse response of a unit-under-test, such as an antenna-under-test, without using impulsive test waveforms.

Figure 2:
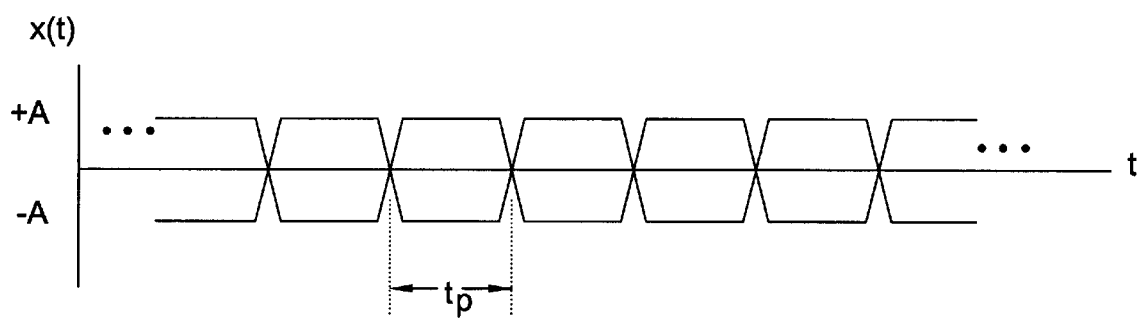
FIG. 2 is a graph showing the rectangular pulses generated with simple digital circuits, a fixed pulse duration $T_p$, with an arbitrarily long code repeat epoch.

In the present invention, the input excitation signal, x(t), is chosen to be a pseudo-random sequence of rectangular pulses, as can be easily generated with simple digital circuits, of fixed pulse duration $t_p$, and with an arbitrarily long code repeat epoch, as shown in FIG. 2.

While x(t) is shown in FIG. 2 as a baseband signal, in practice x(t) may be used to modulate a high frequency sine wave at frequency f0 centered in the band of the antenna-under-test. This may be accomplished in several ways, but one preferred approach, because of its circuit simplicity, is the direct multiplication of x(t) with a sine wave, resulting in a "bi-phase shift keyed" (BPSK) signal:

$$X_{f_0}(t) = x(t) \sin 2\pi f_0 t$$

These equations apply equally well in either baseband or up-converted (modulated) instances, but for simplicity, the following description shall continue using baseband signal representations.

Figure 3:
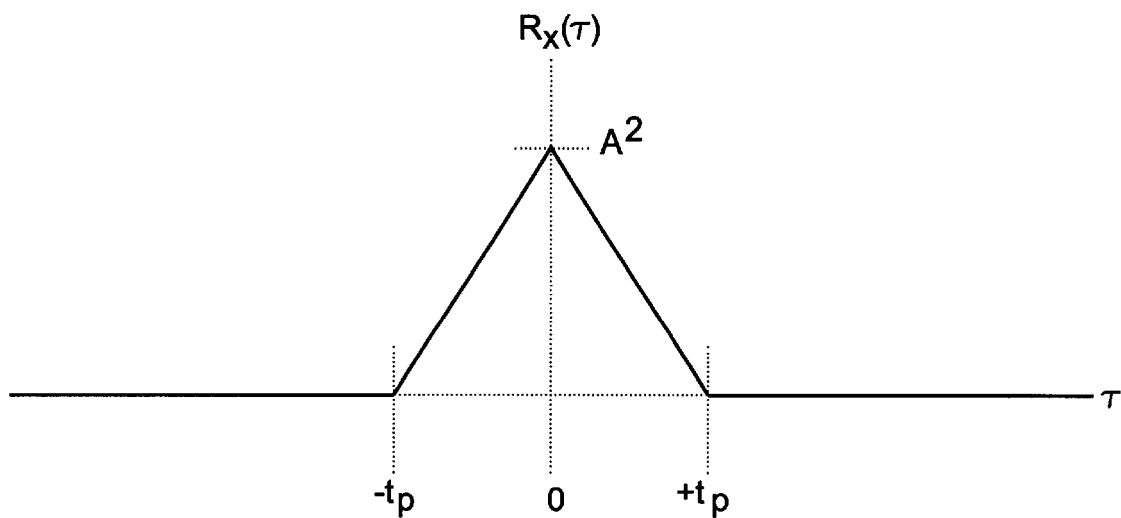
FIG. 3 is a graph showing the auto-correlation function of a sequence (or its up-converted variant).

The auto-correlation function of this sequence (or its up-converted variant) is:

$$R_x(\tau) = A^2 \left(1 - \frac{|\tau|}{t_p}\right) \quad |\tau| < t_p$$
$$\phantom{R_x(\tau) =} 0 \quad |\tau| > t_p$$

which is shown graphically in FIG. 3.

The power spectral density (PSD) of this sequence (assuming a long code epoch) is:

$$G_x(f) = F[R_x(\tau)]$$
$$= \int_{-\infty}^{\infty} R_x(\tau) e^{-j2\pi f t} d\tau$$
$$= A^2 t_p \operatorname{sinc}^2 f t_p$$

Figure 4:
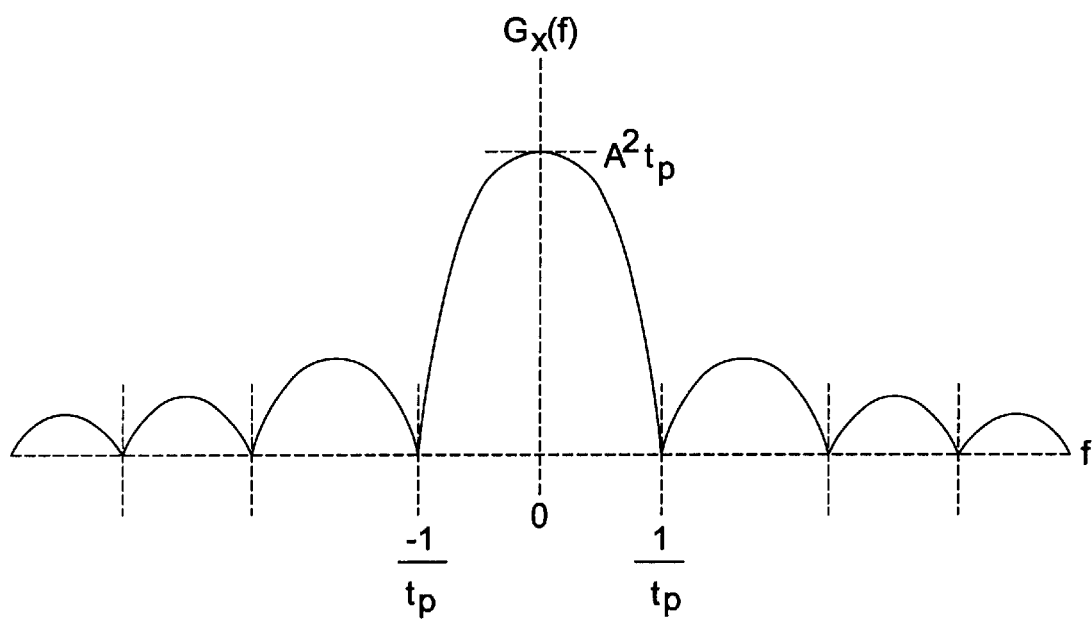
FIG. 4 shows a spectral distribution.

This PSD is shown graphically in FIG. 4.

While Gx(f) is shown centered at zero frequency in FIG. 4, in practice the center frequency is up-converted (modulated, as described before) into the band of the antenna-under-test. The mathematics described herein apply equally well in either case, but for simplicity, the description shall continue using baseband signal representations.

In practice, the pulse duration, tp, is chosen to ensure that the "main-lobe" of Gx(f), with its null-to-null bandwidth of 2/tp, is wider than the expected bandwidth of the unit-under-test. It is possible to measure the frequency response when 2/tp is approximately the same as the expected measurement bandwidth, since the shape of the Rx(τ) and Gx(f) are known and may be subtracted/divided out of the measurements. Another constraint on tp is to ensure that it is much less than the differential path delay of the closest possible reflection, relative to the path delay for the desired test signal. Usually the former requirement on 2/tp bandwidth is more stringent than the latter reflection requirement.

Figure 5:
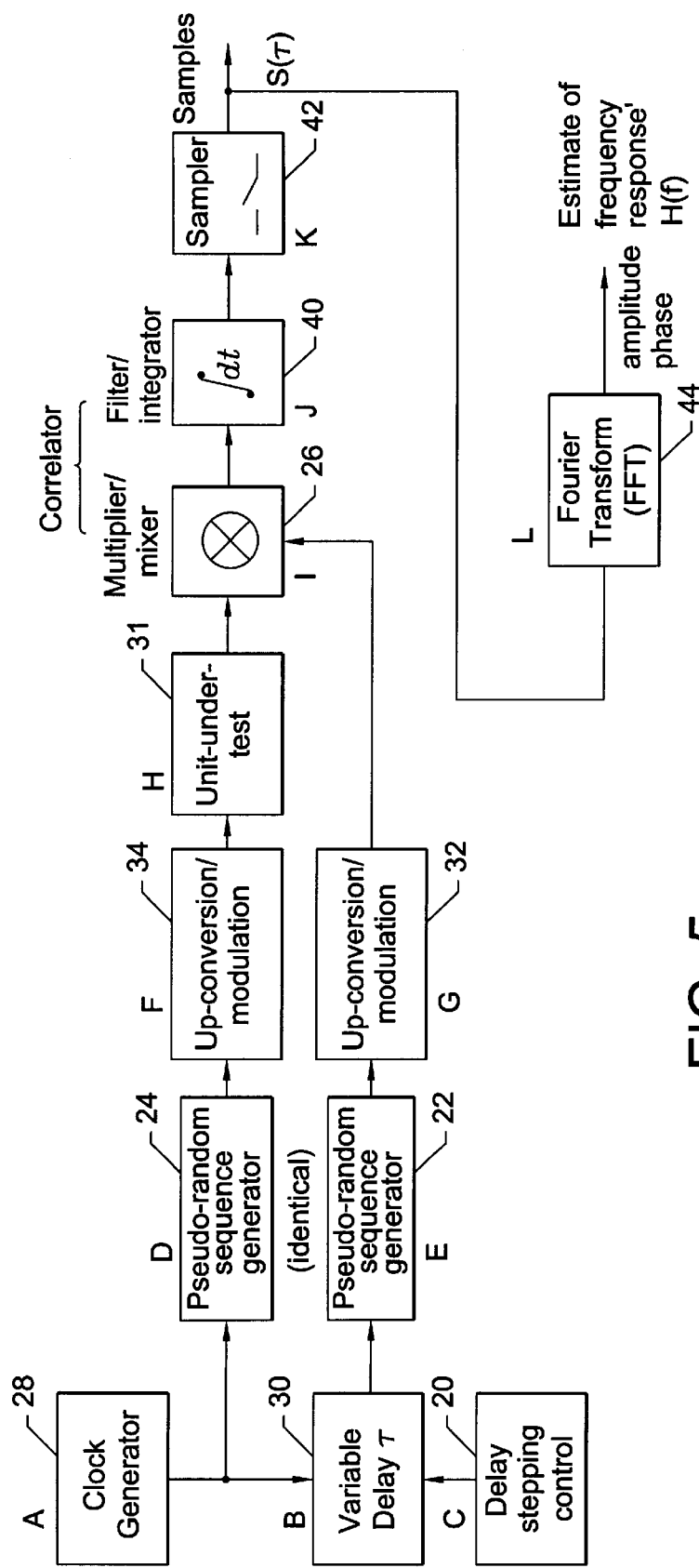
FIG. 5 illustrates one hardware implementation using a correlator and sampler.

FIG. 5 is a simplified block diagram of one variant of this invention. Block diagrams are used to illustrate circuits, which can be designed by techniques known to those skilled in the art. Initially during conduct of testing, the delay stepping control 20 is set to offset the timing of the pseudo-random sequence generator 22 so that the differential delay between generators 24 and 22 corresponds to the differential path delays on the way to the multiplier and mixer 26. A clock generator circuit 28 works in conjunction with variable delay circuit τ 30. This initial timing also corresponds to the earliest possible instance of detectable correlation between the output of the unit-under-test 31 and the output of the up-conversion modulation circuit 32, due to causality of the unit-under-test.

The unit-under-test 31, receives signals from an up-conversion modulation circuit 34 and from pseudo-random random sequence generator circuit 24. The delay is increased (probably automatically) one step at a time, with any arbitrary chosen step increments, while estimates of the correlation, are made and recorded as s(τ). Correlation can be estimated by a multiplier 26 and filter 40, also working as an integrator combination. The filter 40 can be of several different types, but one desired implementation is an integrator which can be set for any selected integration duration, and whose initial condition can be reset to zero to begin a new integration sample. This type of filter is commonly referred to as an "integrate and dump" filter. The sampler 42 extracts the final state of the integration and provides it for recording and analysis. These samples are proportional to the correlation results and to the integration times.

In the frequency domain, the output of the unit-under-test with a pseudo-random input is:

$$Y(f)=G_x(f)H(f)$$

In the time domain, the unit-under-test imparts its impulse response onto the autocorrelation function of the pseudo-random sequence through convolution:

$$y(\tau)=h(\tau)*R_x(\tau)$$

As tp becomes small, Rx(τ) approximates an impulse function.

$$\lim Rx(\tau)=\delta(\tau) \; t_p \to 0$$

and $$\lim y(\tau)=h(\tau)*\delta(\tau)=h(\tau) \; t_p \to 0$$

which is the desired impulse response estimate, in its baseband-equivalent form.

Estimates of h(τ), called S(τ), are derived by the correlator formed from circuits 26 and 40, and sampler 42 as shown in FIG. 5. The delay, τ, is increased in steps and sampling continues until the impulse response is measured to large enough values of τ to substantially capture all the response energy from the unit-under test. Values of S(τ) which are large correspond to high levels of cross-correlation between the outputs of the unit-under-test 31 and the "unfiltered" direct path from up-conversion/modulation circuit 32. The filter will integrate a large "DC" component, corresponding to this high correlation, and relatively little "AC" noise will be observed.

Low values of s(τ) correspond to low cross-correlation, and low values of "DC" will be observed in the presence of large levels of "AC" noise corresponding to the uncorrelated energy. The integration durations may be controlled to establish any desired signal-to-noise ratio that is desired. An computer-automated approach may be used where both the level of the correlated "DC" component and the level of the uncorrelated "AC" levels are monitored at many points during the sample integration to form an estimate of the signal-to-noise ratio. A calculation is performed of the estimated minimum integration time required for a given required signal-to-noise ratio for s(τ). In practice, the complete set of integrations producing a complete series of s(τ) may be accomplished in but a few hundred milliseconds, or at most a few seconds.

Figure 6:
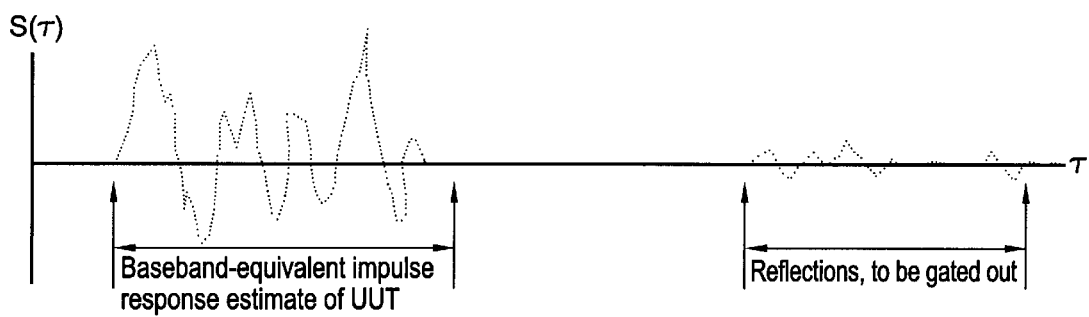
FIG. 6 shows an example of various samples of reflections.

Eventually energy from reflections will correlate at large values of τ, but these can then be easily deleted from the data set with little impact to the data set. FIG. 6 shows an example of s(τ) samples. Reflections and extraneous interference effect the measurement of early samples of s(τ), those in the desired time frame of the impulse response, by a decrease in the signal-to-noise ratio, which will require longer integration durations to achieve desired signal-to-noise ratios than in the absence of reflections or interference. However, these unwanted signals do not impart any measurement bias (a "DC" component from the integrator); they only increase the "random" noise ("AC") component which can be reduced to arbitrarily low levels by filtering choices.

After a satisfactory set of s(τ) samples data has been recorded, the frequency response may be derived from this data by straightforward application of the Fourier transform within a processor (44 in FIG. 5), such as by using a Fast Fourier Transform (FFT). Using mathematics known to those skilled in the art, both amplitude response and phase response may be calculated.

Other details can be suggested to those skilled in the art. The pseudo-random noise sequence can be generated by pulse phase modulator having a shift keyed modulator. The pulse phase modulator can comprise a doubly balanced mixer. Alternately, the modulator could include a circuit for generating a frequency-hopped spread spectrum signal or a chirp signal or combinations of types.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method for testing frequency response of a linear, time-invariant unit-under-test comprising:

generating a test signal at a selected frequency;

modulating the test signal with a spread spectrum input excitation signal to produce a broad band test signal that is substantially wider than the bandwidth of a device-under-test;

transmitting the test signal from one of either the unit-under-test or a test device to a respective test device or unit-under-test; and demodulating the broad band test signal by mixing an input excitation signal that is delayed and increased in steps such that the difference in time generates an estimate of the impulse response of the unit-under-test, the step of demodulating also including the step of correlating and integrating the test signal, thereby filtering out unwanted interference and reflections.

2. A method according to claim 1, wherein the demodulating step further comprises the step of correlating the test signal within a multiplier/mixer and then integrating the test signal within a filter/integrator, thereby filtering out unwanted interference and reflections.

3. A method according to claim 2, and further comprising the step of sampling after correlation until the impulse response is measured to substantially capture the response energy of the unit-under-test, while rejecting later spurious reflections.

4. A method according to claim 1, and further comprising the step of forming the broad band test signal as a phase shift keyed signal.

5. A method according to claim 1, and further comprising the step of forming the broad band test signal as a frequency-hopping spread spectrum signal.

6. A method according to claim 1, and further comprising the step of forming the broad band test signal as a chirp spread spectrum signal.

7. A method according to claim 1, and further comprising the step of forming the broad band test signal as a pseudo-random noise pulse modulation signal.

8. A method according to claim 1, and further comprising the step of modulating the test signal with a pulse phase modulator having a shift keyed modulator.

9. A method according to claim 1, and further comprising the step of modulating within a mixer.

10. A method according to claim 1, wherein said mixer comprises a doubly balanced mixer.

11. A method according to claim 1, and further comprising the step of using a deterministic broad band or spread spectrum waveform, including generated or recorded, whether pseudorandom or random.

12. A method according to claim 1, and further comprising the step of analyzing the demodulated test signal within a spectrum analyzer, or by processing with a Fourier transform.

13. A method for testing antenna frequency response comprising:

generating an antenna test signal at a selected frequency;

modulating the antenna test signal with an input excitation signal to produce a broad band test signal that is substantially wider than the bandwidth of an antenna-under-test;

transmitting the test signal from one of either the antenna-under-test or test antenna to a respective test antenna or antenna-under-test; and demodulating the broad band test signal by mixing an input excitation signal that is delayed and increased in steps such that the difference in time generates an estimate of the impulse response of the antenna-under-test, the step of demodulating also including the step of correlating and integrating the test signal, thereby filtering out unwanted interference and reflections.

14. A method according to claim 13, wherein the demodulating step further comprises the step of correlating the test signal within a multiplier/mixer and then integrating the antenna test signal within a filter/integrator, thereby filtering out unwanted interference and reflections.

15. A method according to claim 13, and further comprising the step of sampling after correlation until the impulse response is measured to substantially capture the response energy of the antenna-under-test, while rejecting later spurious reflections.

16. A method according to claim 13, and further comprising the step of forming the broad band test signal as a phase shift keyed signal.

17. A method according to claim 13, and further comprising the step of forming the broad band test signal as a frequency-hopping spread spectrum signal.

18. A method according to claim 13, and further comprising the step of forming the broad band test signal as a chirp spread spectrum signal.

19. A method according to claim 13, and further comprising the step of forming the broad band test signal as a pseudo-random noise pulse modulation signal.

20. A method according to claim 13, and further comprising the step of modulating the antenna test signal with a pulse phase modulator having a shift keyed modulator.

21. A method according to claim 13, and further comprising the step of modulating within a mixer.

22. A method according to claim 13, wherein said mixer comprises a doubly balanced mixer.

23. A method according to claim 13, using any deterministic broad band or spread spectrum waveform, whether generated or recorded, whether pseudorandom or random.

24. A method according to claim 13, and further comprising the step of analyzing the demodulated antenna test signal within a spectrum analyzer, or by processing with a Fourier transform.

25. A method for testing an antenna frequency response comprising:

generating an antenna test signal at a selected frequency;

modulating the signal with a pseudo-random noise sequence to produce a broad band spread spectrum antenna test signal that is wider than the bandwidth of an antenna-under-test;

transmitting from the antenna-under-test the spread spectrum antenna test signal to a test antenna;

demodulating the broad band spread spectrum antenna test signal by mixing the broad band spread spectrum antenna test signal with the respective pseudo-random noise sequence at an increasingly delayed time in steps; and sampling the demodulated spread spectrum antenna test signal until the impulse response is measured to substantially capture the response energy of the antenna-under-test.

26. A method according to claim 25, wherein the demodulating step further comprises the step of correlating the antenna test signal within a multiplier/mixer and then integrating the antenna test signal within a filter/integrator.

27. A method according to claim 25, and further comprising the step of modulating the antenna test signal with a shift keyed modulator.

28. A method according to claim 27, and further comprising the step of modulating within a mixer.

29. A method according to claim 28, wherein said mixer comprises a doubly balanced mixer.

30. A method according to claim 25, and further comprising the step of using a deterministic broad band or spread spectrum waveform, including generated or recorded, whether pseudorandom or random.

31. A method according to claim 25, and further comprising the step of generating the pseudo-random noise sequence such that the spread energy is substantially within the bandwidth of the antenna-under-test.

32. A method according to claim 31, and further comprising the step of generating the respective pseudo-random noise sequences at a predetermined delayed time in an oscillator that is synchronized with the transmitted spread spectrum signals and including a pseudo-random noise generator.

33. A method according to claim 25, and further comprising the step of analyzing the received signal within a spectrum analyzer.

34. A system for testing an frequency response of a linear time-invariant unit-under-test comprising:

a signal generator for generating a test signal at a selected frequency;

a modulator for modulating the test signal with an input excitation signal to produce a broad band test signal;

a unit-under-test connected to the modulator for receiving and transmitting the broad band test signal, wherein said broadband spread spectrum test signal has a bandwidth that is substantially greater than the bandwidth of the unit-under-test;

a device for receiving the broad band spread spectrum test signal from the unit-under-test;

a demodulator circuit connected to the device for receiving and demodulating the broadband test signal and further comprising a correlator circuit, including a multiplier/mixer that receives an input excitation signal that is delayed in time and increased in steps and a filter/integrator for integrating the antenna test signal to obtain an estimate of the impulse response of the unit-under-test.

35. A system according to claim 34, and further comprising a sampling circuit for sampling the test signal after integration to substantially capture the response energy of the antenna-under-test.

36. A system according to claim 34, and further comprising a processor for performing a Fourier transform on the signal after sampling.

37. A system according to claim 34, wherein said modulator further comprises a pulse phase modulator having a shift keyed modulator for generating a pseudo-random noise sequence.

38. A system according to claim 37, wherein said pulse phase modulator comprises a mixer.

39. A system according to claim 38, wherein said mixer comprises a doubly balanced mixer.

40. A system according to claim 34, wherein said modulator comprises a circuit for generating a frequency-hopped spread spectrum signal.

41. A system according to claim 34, wherein said modulator comprises a circuit for generating a chirp signal.

42. A system according to claim 34, and further comprising a circuit for analyzing the demodulated antenna test signal with a Fourier transform.

43. A system for testing an antenna frequency response comprising:

a signal generator for generating an antenna test signal at a selected frequency;

a modulator for modulating the antenna test signal with an input excitation signal to produce a broad band antenna test signal;

an antenna-under-test connected to the modulator for receiving and transmitting the broad band antenna test signal, wherein said broadband spread spectrum antenna test signal has a bandwidth that is substantially greater than the bandwidth of the antenna-under-test;

a test antenna for receiving the broad band spread spectrum antenna test signal from the antenna-under-test;

a demodulator circuit connected to the test antenna for receiving and demodulating the broadband antenna test signal and further comprising a correlator circuit, including a multiplier/mixer that receives an input excitation signal that is delayed in time and increased in steps and a filter/integrator for integrating the antenna test signal to obtain an estimate of the impulse response of the antenna-under-test.

44. A system according to claim 43, and further comprising a sampling circuit for sampling the antenna test signal after integration to substantially capture the response energy of the antenna-under-test.

45. A system according to claim 44, and further comprising a processor for performing a Fourier transform on the signal after sampling.

46. A system according to claim 43, wherein said modulator further comprises a pulse phase modulator having a shift keyed modulator for generating a pseudo-random noise sequence.

47. A system according to claim 46, wherein said pulse phase modulator comprises a mixer.

48. A system according to claim 47, wherein said mixer comprises a doubly balanced mixer.

49. A system according to claim 43, wherein said modulator comprises a circuit for generating a frequency-hopped spread spectrum signal.

50. A system according to claim 43, wherein said modulator comprises a circuit for generating a chirp signal.

51. A system according to claim 43, and further comprising a circuit with Fourier transform for analyzing the demodulated antenna test signal.

52. A system for testing an antenna frequency response comprising:

a signal generator for generating an antenna test signal at a selected frequency;

a pulse phase modulator for modulating the signal with a pseudo-random noise sequence to produce a broad band spread spectrum antenna test signal;

an antenna-under-test connected to the modulator for receiving and transmitting the broad band antenna test signal, wherein said broadband spread spectrum antenna test signal has a bandwidth that is substantially greater than the bandwidth of the antenna-under-test;

a test antenna for receiving the broad band spread spectrum antenna test signal from the antenna-under-test;

a demodulation circuit connected to the test antenna for receiving and demodulating the spread spectrum antenna test signal and further comprising:

a pseudo-random noise generator for generating the respective pseudo-random noise sequence at a predetermined delayed time and increased in steps;

a correlator circuit, including a multiplier/mixer for mixing the broad band spread spectrum antenna test signal with the generated pseudo-random noise sequence and a filter/integrator for integrating the antenna test signal to obtain an estimate of the impulse response of the antenna-under test.

53. A system according to claim 52, wherein said antenna-under-test and test antenna each comprises a horn antenna.

54. A system according to claim 52, wherein said pulse phase modulator comprises a shift keyed modulator.

55. A system according to claim 54, wherein said pulse phase modulator comprises a mixer.

56. A system according to claim 55, wherein said mixer comprises a doubly balanced mixer.

57. A system according to claim 52, wherein said pseudo-random noise generator for generating the respective pseudo-random noise sequences at a predetermined delayed time comprises an oscillator that is synchronized with the transmitted spread spectrum signal and including a pseudo-random noise generator.

58. A system according to claim 52, wherein said receiver further comprises a spectrum analyzer for analyzing the demodulated antenna test signal.

* * * * *